(12) United States Patent
Park et al.

(10) Patent No.: US 7,968,454 B2
(45) Date of Patent: Jun. 28, 2011

(54) METHOD OF FORMING PATTERN STRUCTURE

(75) Inventors: Imsoo Park, Seongnam-si (KR); Kuntack Lee, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/656,084

(22) Filed: Jan. 15, 2010

(65) Prior Publication Data

US 2010/0184288 A1   Jul. 22, 2010

(30) Foreign Application Priority Data

Jan. 21, 2009   (KR) .................. 10-2009-0005193

(51) Int. Cl.
*H01L 21/4763* (2006.01)
(52) U.S. Cl. .............. 438/638; 438/640; 257/E21.577
(58) Field of Classification Search .......... 438/638, 438/640; 257/E21.577
See application file for complete search history.

(56) References Cited

U.S. PATENT DOCUMENTS

| | | | |
|---|---|---|---|
| 2003/0008499 A1* | 1/2003 | Kobayashi | 438/637 |
| 2004/0056281 A1* | 3/2004 | Shin et al. | 257/213 |
| 2008/0258310 A1* | 10/2008 | Fukumoto | 257/774 |

FOREIGN PATENT DOCUMENTS

| | | |
|---|---|---|
| JP | 2005-317863 A | 11/2005 |
| KR | 10 2003 0002715 A | 1/2003 |
| KR | 10 2005 0002010 A | 1/2005 |

* cited by examiner

*Primary Examiner* — Trung Dang
(74) *Attorney, Agent, or Firm* — Lee & Morse, P.C.

(57) ABSTRACT

A method of forming a pattern structure includes forming a thin film pattern on a substrate, the thin film pattern including depression portions with first bottom widths, forming a protection layer on the thin film pattern by implanting ions into the thin film pattern, and etching a lower portion of the thin film pattern selectively using the protection layer as a mask to increase the first bottom widths of the depression portions into second bottom widths.

16 Claims, 11 Drawing Sheets

METHOD OF FORMING PATTERN STRUCTURE

BACKGROUND

1. Field

Example embodiments relate to methods of forming a pattern structure. More particularly, example embodiments relate to methods of forming a pattern structure capable of preventing damage of a thin film pattern.

2. Description of the Related Art

Generally, processes for manufacturing a semiconductor device may include various solution treatment processes. For example, after forming a thin film pattern including depression portions, e.g., a contact hole, a trench, etc., on a semiconductor substrate, a process of cleaning and etching the semiconductor substrate using solution treatment processes, e.g., wet cleaning, wet etching, etc., may be performed. Such solution treatment processes may be performed by providing various kinds of chemical solutions to the semiconductor substrate. After that, conductors, e.g., a contact plug, a metal interconnection, etc., may be formed on the semiconductor substrate by filling the depression portions with conductive material.

As a semiconductor pattern becomes finer, a width of each of the depression portions and a space between the depression portions may decrease. Thus, if the depression portions are over-etched by the chemical solutions during the solution treatment process, adjacent depression portions may be connected to one another, thereby causing formation of interconnected adjacent conductors, e.g., interconnected upper portions of adjacent conductors forming a "pattern bridge," when the conductive material is filled in the interconnected depression portions.

SUMMARY

Embodiments are therefore directed to methods of forming a pattern structure, which substantially overcome one or more of the problems due to the limitations and disadvantages of the related art.

It is therefore a feature of an embodiment to provide a method of forming a pattern structure with a contact plug and a metal interconnection having a reduced contact resistance therebetween.

It is another features of an embodiment to provide a method of forming a pattern structure with a protection layer to prevent or minimize over-etching.

At least one of the above and other features and advantages may be realized by providing a method of forming a pattern structure, including forming a thin film pattern on a substrate, the thin film pattern including depression portions with first bottom widths, forming a protection layer on the thin film pattern by implanting ions into the thin film pattern, and etching a lower portion of the thin film pattern selectively using the protection layer as a mask to increase the first bottom widths of the depression portions into second bottom widths.

Forming the protection layer may include implanting ions into an upper portion of the thin film pattern, such that the lower portion of the thin film pattern is exposed. Forming the protection layer may include implanting ions only into the upper portion of the thin film pattern, such that etching of the lower portion is performed selectively between the substrate and the upper portion of the thin film pattern. Forming the thin film pattern may include forming an oxide layer on the substrate, and forming the protection layer may include forming a film having a lower etch rate than the oxide layer, the film including at least one of a silicon oxide (SiO), an oxy-nitride (ON), a silicon nitride (SiN), a silicon oxy-nitride (SiON), an oxide germanium (OGe), a silicon oxide germanium (SiOGe), a silicon nitride germanium (SiNGe), a silicon oxy-nitride germanium (SiONGe), an carbon mono-oxide (CO), a silicon oxy-carbon (SiCO), a silicon nitride carbon (SiCN), and a silicon oxy-nitride carbon (SiCON). Forming the protection layer may include performing an oblique ion implantation process on the thin film pattern, a thickness of the protection layer into the thin film pattern and a length of the protection layer along an upper portion of the thin film pattern relative to a depth of the depression being controlled by adjusting ion implantation angle and energy level, respectively.

Forming the protection layer may include implanting ions of at least one of silicon (Si), oxygen (O), nitrogen (N), germanium (Ge) and carbon (C) into the thin film pattern. Etching the lower portion of the thin film pattern may include selectively performing a solution treatment on the lower portion of the thin film pattern. The method may further include annealing the thin film pattern. The annealing may be performed before the etching. The annealing may be performed after forming the protection layer. The method may further include forming a conductor in at least one of the depression portions, such that the conductor fills the entire second bottom width of the depression portion. Forming the conductor may include positioning the conductor in direct contact with a conductive layer in the substrate, such that the second bottom width of the depression portion defines a length of a surface contact between the conductor and the conductive layer.

At least one of the above and other features and advantages may also be realized by providing a method of forming a pattern structure, including forming a thin film on a substrate including a conductive layer, forming a depression portion exposing the conductive layer on the thin film, extending a bottom width of depression portion adjacent to the conductive layer, and forming a conductor electrically connected to the conductive layer by filling the depression portion.

Extending the first bottom widths of the depression portions may include implanting ions into an upper portion of the thin film pattern to form a protection layer on the upper portion of the thin film pattern, and selectively etching a lower portion of the thin film pattern using the protection layer as a mask, the lower portion being between the upper portion and the substrate and being exposed by the protection layer. Extending the first bottom widths of the depression portions may include etching only a lower portion of the thin film patter, such that top widths of the depression portions are substantially constant. Forming the conductor may include completely filling the second bottom width of the depression portion with a conductive material, the second bottom width of the depression portion defining a length of a surface contact between the conductive layer and the conductor.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
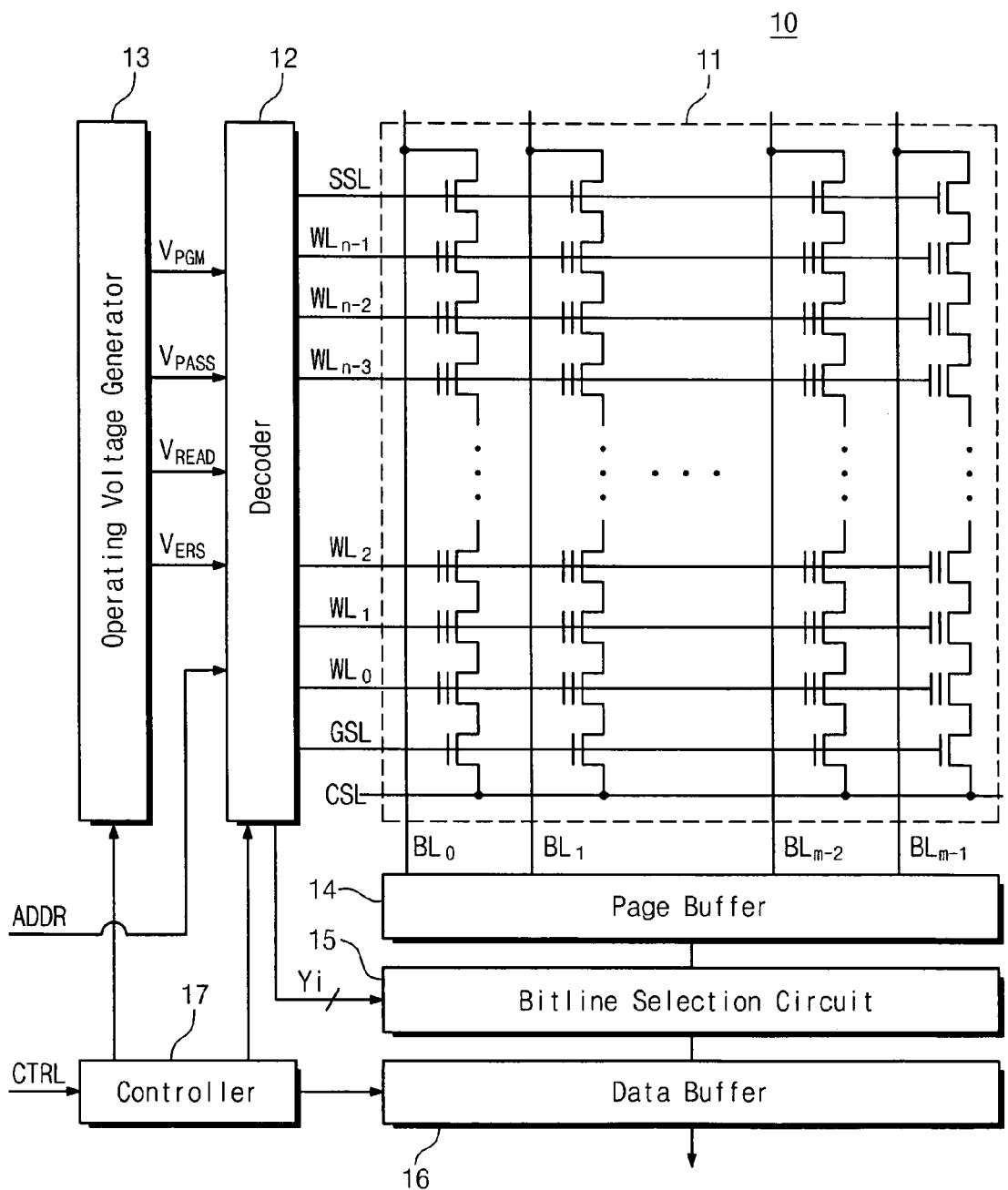
FIG. 1 illustrates an equivalent circuit of a configuration of a semiconductor apparatus including a semiconductor device having a pattern structure in accordance with an embodiment.

Korean Patent Application No. 10-2009-0005193, filed on Jan. 21, 2009, in the Korean Intellectual Property Office, and entitled: "Method of Forming Pattern Structure," is incorporated by reference herein in its entirety.

Example embodiments will be described below in more detail with reference to the accompanying drawings. The embodiments of the inventive concept may, however, be embodied in different forms and should not be constructed as limited to the embodiments set forth herein. Rather, these embodiments are provided so that this disclosure will be thorough and complete, and will fully convey the scope of the inventive concept to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates an equivalent circuit of a configuration of a semiconductor apparatus including a semiconductor device having a pattern structure in accordance with an embodiment. Referring to FIG. 1, a semiconductor apparatus 10 including a semiconductor device having a pattern structure in accordance with an embodiment may include a NAND flash memory cell array 11, a decoder 12, an operation voltage generation circuit 13, a page buffer 14, a bit line selection circuit 15, a data buffer 16, and a controller 17.

The memory cell array 11 may include a ground select line GSL, a string select line SSL, and a plurality of word lines $WL_0 \sim WL_{n-1}$ disposed on an active region of a semiconductor device. The word lines $WL_0 \sim WL_{n-1}$ may be disposed between the ground select line GSL and the string select line SSL, and bit lines $BL_0 \sim BL_{m-1}$ crossing the word lines $WL_0 \sim WL_{n-1}$ may be disposed to be connected to an active region of one side of the string line SSL. A common source line CSL parallel to the word lines $WL_0 \sim WL_{n-1}$ may be disposed on an active region of one side of the ground select line GSL. The NAND memory cell array 11 may include a plurality of memory blocks, each of the memory blocks may include a plurality of pages (e.g., 32 pages or 64 pages), and each page may include a plurality of memory cells (e.g., 512 Byte, 2K Byte) sharing one word line. In a case of the NAND flash memory described above, an erasing operation may be performed by a memory block unit, and a read operation and a write operation may be performed by a page unit.

The decoder 12 may be connected to the cell array 11 of the NAND flash memory through the word lines $WL_0 \sim WL_{n-1}$, and may be controlled by the controller 17. The decoder 12 may receive an address ADDR from a memory controller (not shown), and may generate a select signal Yi to select a predetermined word line or a predetermined bit line.

The page buffer 14 may be connected to the memory cell array 11 through the bit lines $BL_0 \sim BL_{m-1}$, and may store data loaded from the data buffer 16. Data of a quantity of a page may be loaded in the page buffer 14, and the loaded data may be concurrently programmed on the selected page (e.g., page 1) when a program operation is performed. The page buffer 14 may read data from a selected page (e.g., page 1), and may preliminary store the read data. Data stored in the page buffer 14 may be transmitted to a memory controller (not shown) in response to a read enable signal.

The bit line selection circuit 15 may be a circuit for selecting a bit line in response to the select signal Yi. The data buffer 16 may be an input/output buffer used in transmitting data between the memory controller (not shown) and the semiconductor apparatus 10. The controller 17 may be a circuit that receives a control signal CTRL from a memory controller (not shown) to control an internal operation of the semiconductor apparatus 10. The operation voltage generation circuit 13 may generate various voltages (e.g., a program voltage $V_{PGM}$, a pass voltage $V_{PASS}$, a read voltage $V_{READ}$, and an erasing voltage) used for an operation of the memory cell array 11 in response to a control of the controller 17.

Figure 2:
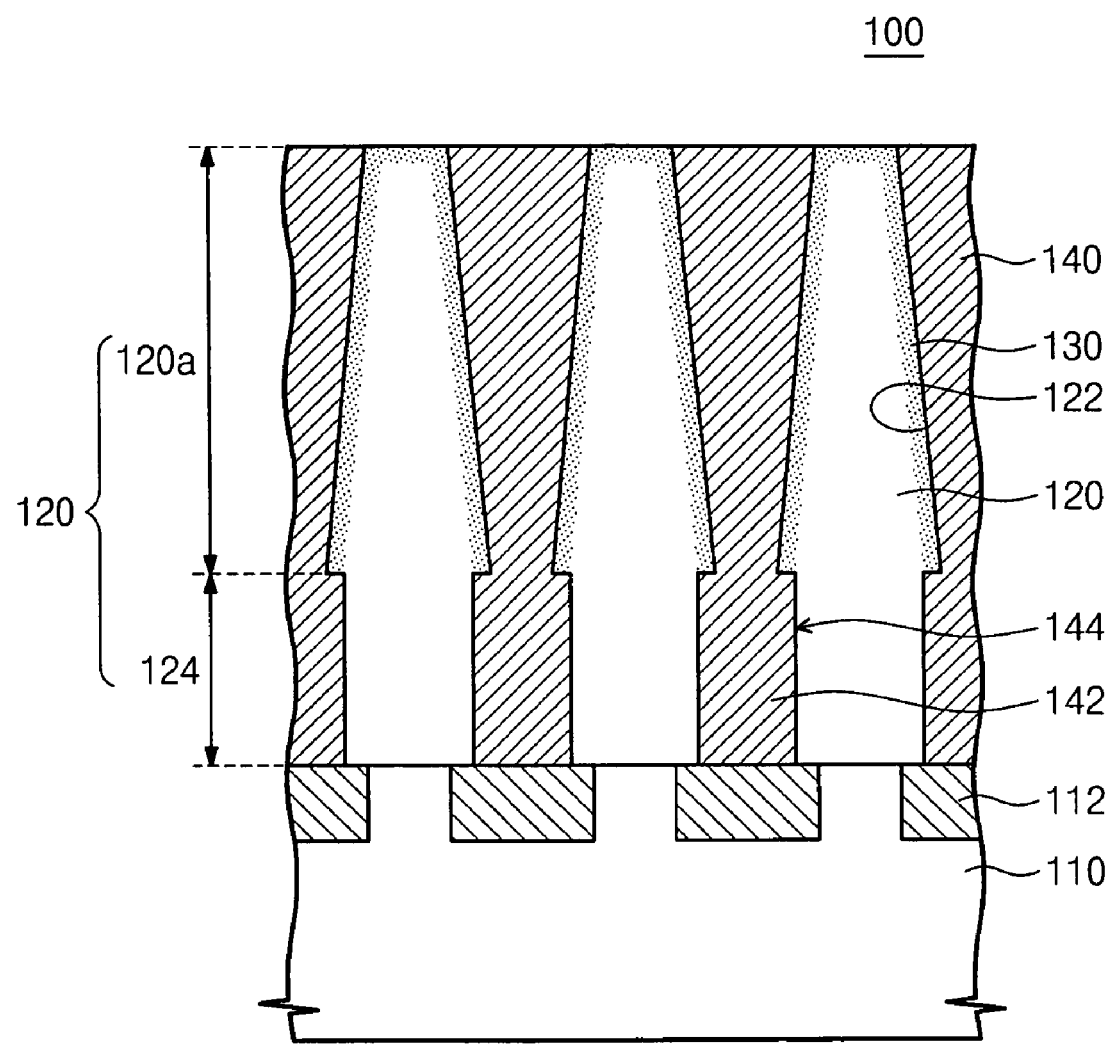
FIG. 2 illustrates a cross-sectional view of a pattern structure in accordance with an embodiment.

FIG. 2 illustrates a cross-sectional view of a pattern structure in accordance with an embodiment. Referring to FIG. 2, a pattern structure 100 in accordance with an embodiment may include a thin film pattern 120 disposed on a substrate 110, a protection layer 130 formed on the thin film pattern 120, and a conductor 140.

The substrate 110 may include a semiconductor substrate for manufacturing a semiconductor integrated circuit chip. For example, the substrate 110 may be a p-type wafer with a p-type impurity, e.g., boron. A conductive layer 112 may be formed on the substrate 110. For example, the conductive layer 112 may include a plurality of discrete conductive portions embedded in an upper portion of the substrate 110 and spaced apart from each other. Upper surfaces of the substrate 110 and the conductive layer 112 may be substantially level. The conductive layer 112 may include a doped layer and a metal layer. The doped layer may include a source and a drain electrode. The metal layer may include a metal interconnection. The conductive layer 112 and the conductor 140 may be connected to each other electrically.

The thin film pattern 120 may be disposed on the substrate 110. The thin film pattern 120 may include an insulating layer. For example, the thin film pattern 120 may include one or more of an oxide layer, a silicon oxide layer, and a silicon oxy-nitride layer.

The thin film pattern 120 may include a plurality of depression portions 122 spaced apart from each other. For example, the depression portions 122 may be openings extending from a top surface of the thin film pattern 120 toward the substrate 110 to expose the substrate 110. When another layer (e.g., an interlayer insulating layer, a metal layer, etc.) is interposed between the substrate 110 and the thin film pattern 120, the depression portions 122 may expose the other layer. For example, the depression portions 122 may extend through the thin film pattern 120 to expose the conductive layer 112.

The protection layer 130 may prevent the thin film pattern 120 from being etched by an etching solution. The protection layer 130 may be disposed inside the thin film pattern 120. For example, the protection layer 130 may be formed on a surface of the thin film pattern 120, and may extend to a predetermined depth of the thin film pattern 120. The protection layer 130 may be formed, e.g., by an ion implantation process on the thin film pattern 120. The protection layer 130 may be selectively formed on, e.g., only on, an upper portion 120a of the thin film pattern 120. For example, the protection layer 130 may be formed conformally on the upper portion 120a of the thin film pattern 120 to cover an upper surface of the thin film pattern 120 and upper portions of sidewalls extending from the upper surface toward the substrate 110. Thus, a lower portion 124 of thin film pattern 120, i.e., a portion of the thin film pattern 120 between the substrate 110 and the upper portion 120a of the thin film pattern 120, may not be covered with the protection layer 130, i.e., exposed, and may be etched by an etching solution, as will be discussed in more detail below with reference to FIG. 4D.

The protection layer 130 may be a material having an etching selectivity with respect to the thin film pattern 120. For example, the protection layer 130 may include one or more of a silicon oxide layer (SiO), an oxy-nitride layer (ON), a silicon nitride layer (SiN), a silicon oxy-nitride layer (SiON), an oxide germanium layer (OGe), a silicon oxide germanium layer (SiOGe), a silicon nitride germanium layer (SiNGe), a silicon oxy-nitride germanium layer (SiONiGe), a carbon mono-oxide layer (CO), a silicon oxy-carbon layer (SiCO), a silicon nitride carbon layer (SiCN) and a silicon oxy-nitride carbon layer (SiCON). Further, the thin film pattern 120 and the protection layer 130 may include the same material, and an impurity concentration in the thin film pattern 120 may be different from that of the protection layer 130 in order to provide etching selectivity. For example, if the thin film pattern 120 and the protection layer 130 are silicon oxide layers, a silicon concentration of the thin film pattern 120 may be different from that of the protection layer 130.

The conductor 140 may be disposed inside the depression portions 122. The conductor 140 may be formed by filling the inside of the depression portions 122 with conductive material. The conductor 140 may be used, e.g., as a contact plug or a metal interconnection. The conductor 140 may include an extension portion 142 in a lower part 144 of the conductor 140. The extension portion 142 may be a portion of the conductor 140. The lower part 144 of the conductor 140 may be disposed to face a side surface of the lower part 124 of the thin film pattern 120. Thus, as illustrated in FIG. 2, even though a width of an upper part of the conductor 140 may decrease as a distance from the substrate 110 decreases, a width of the lower part 144 of the conductor 140 may be larger than a smallest width of the upper part of the conductor 140. In other words, since the lower part 124 of the thin film pattern 120 is not covered with the protection layer 130 and is etched, i.e., having reduced width, the lower part 144 of the conductor 140 adjacent to the lower part 124 of the thin film pattern 120 may have an increased width. Therefore, an area of the extension portion 142 in contact with the semiconductor substrate 110, i.e., a surface contact between the lower part 144 of the conductor 140 and the conductive layer 112 in the substrate 110, may be increased. In other words, an area of the conductor 140 that is in contact with the conductive layer 112 may be increased by the extension portion 142. Accordingly, a contact resistance between the conductor 140 and the conductive layer 112 may be decreased.

Figure 3:
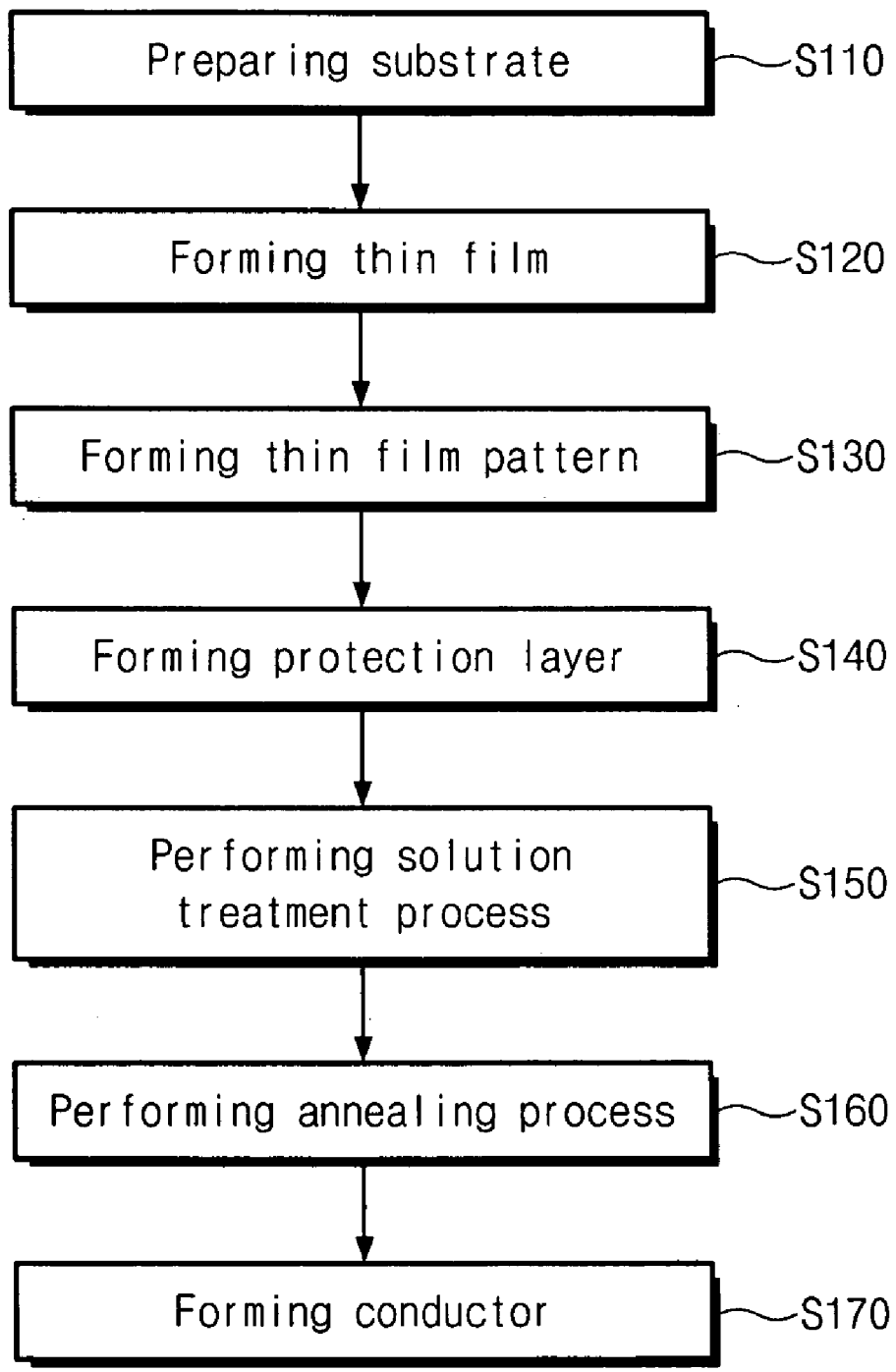
FIG. 3 illustrates a flow chart of a method of forming a pattern structure in accordance with an embodiment.

A process of forming the pattern structure 100 in accordance with an embodiment is described in detail below with reference to FIGS. 3-5B. FIG. 3 illustrates a flow chart of a method of forming the pattern structure 100. FIGS. 4A through 4E illustrate cross-sectional views of stages in a method of forming the pattern structure 100. FIGS. 5A and 5B illustrate cross-sectional views of an oblique ion implantation process in accordance with an embodiment.

Figure 4A:
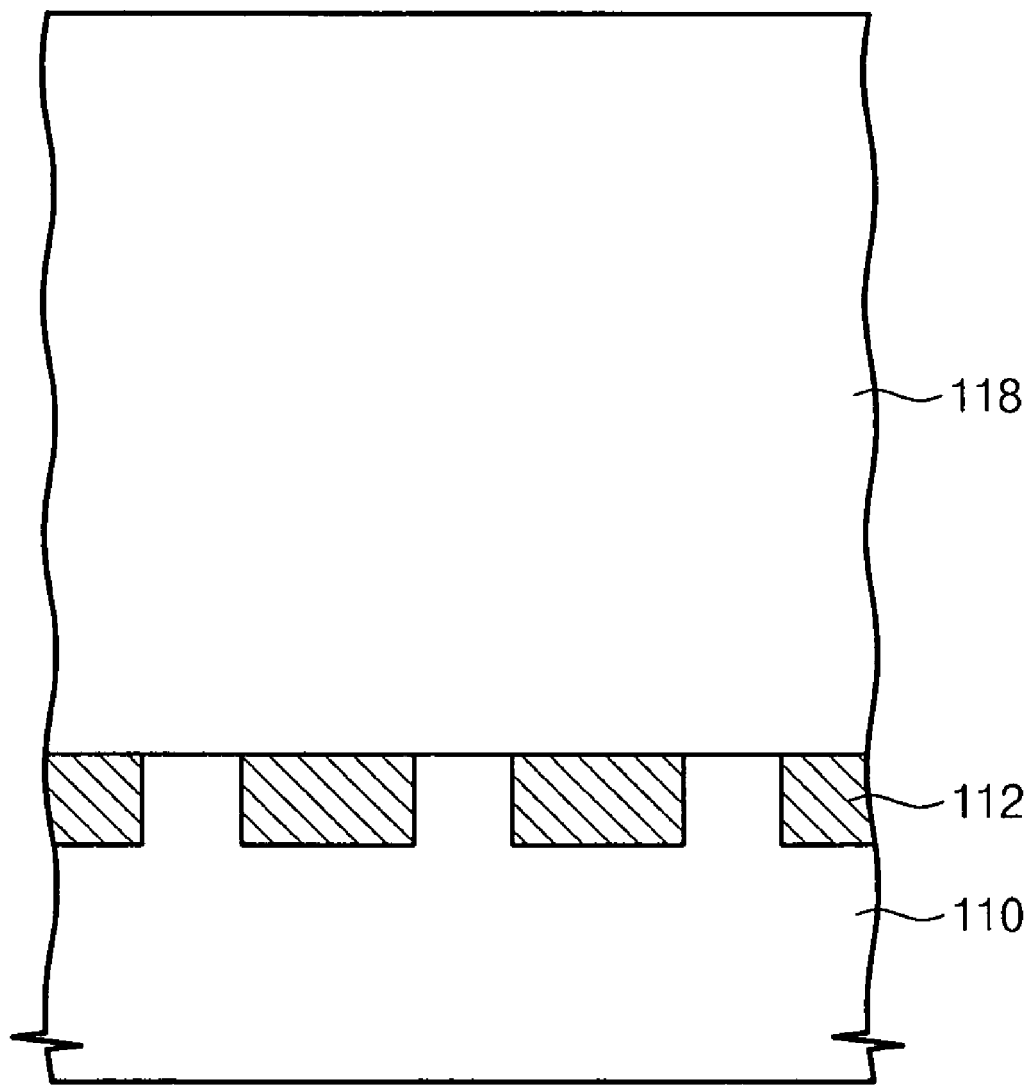
FIGS. 4A through 4E illustrate cross-sectional views of stages in a method of forming a pattern structure in accordance with an embodiment.
Figure 5A:
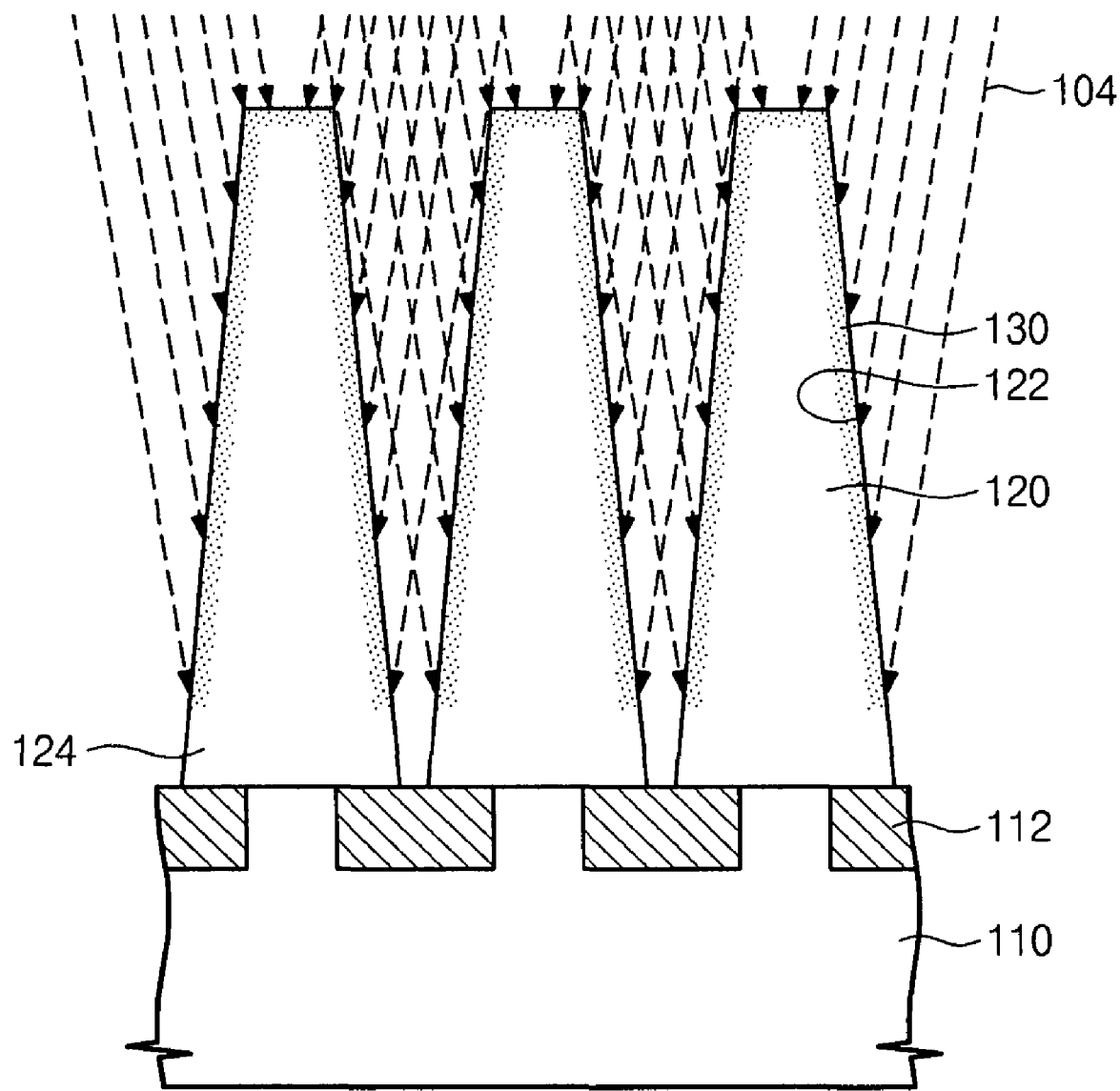
FIGS. 5A and 5B illustrate cross-sectional views of an oblique ion implantation process in accordance with an embodiment.
Figure 5B:
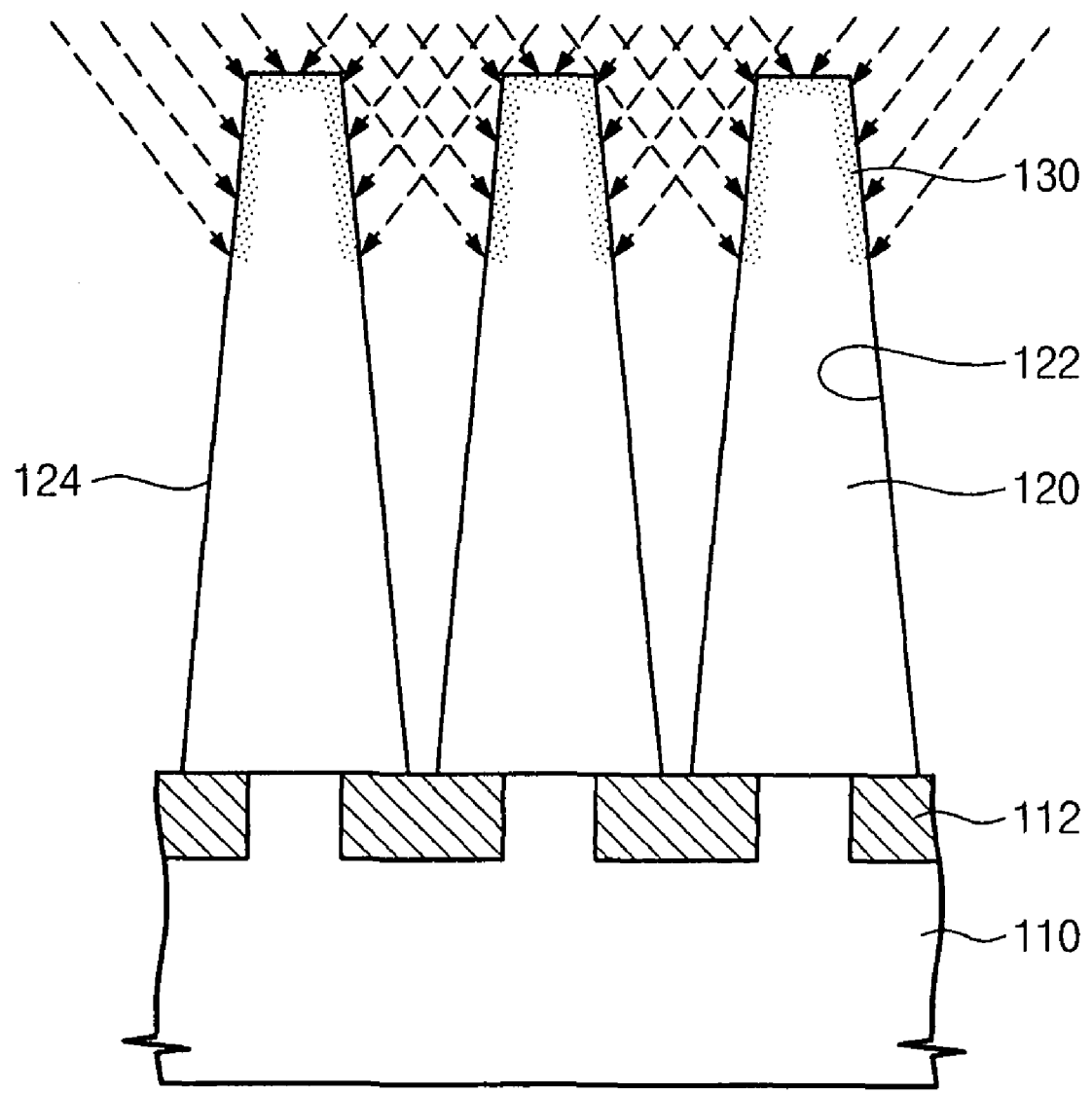

Referring to FIGS. 3 and 4A, the substrate 110 may be prepared (S110). The substrate 110 may be a single crystalline bulk silicon substrate, e.g., a p-type silicon wafer with p-type impurity such as boron. Preparing the substrate 110 may include forming the conductive layer 112 on the substrate 110. Forming the conductive layer 112 may include forming a doped layer and/or a metal layer on the substrate 110.

A thin film 118 may be formed on the substrate 110 (S120). The thin film 118 may be an insulating layer. The thin film 118 may be formed, e.g., by a chemical vapor deposition (CVD) process, a physical vapor deposition (PVD) process, an atomic layer deposition (ALD) process, an ion sputtering process, or a thermal oxide process.

Figure 4B:
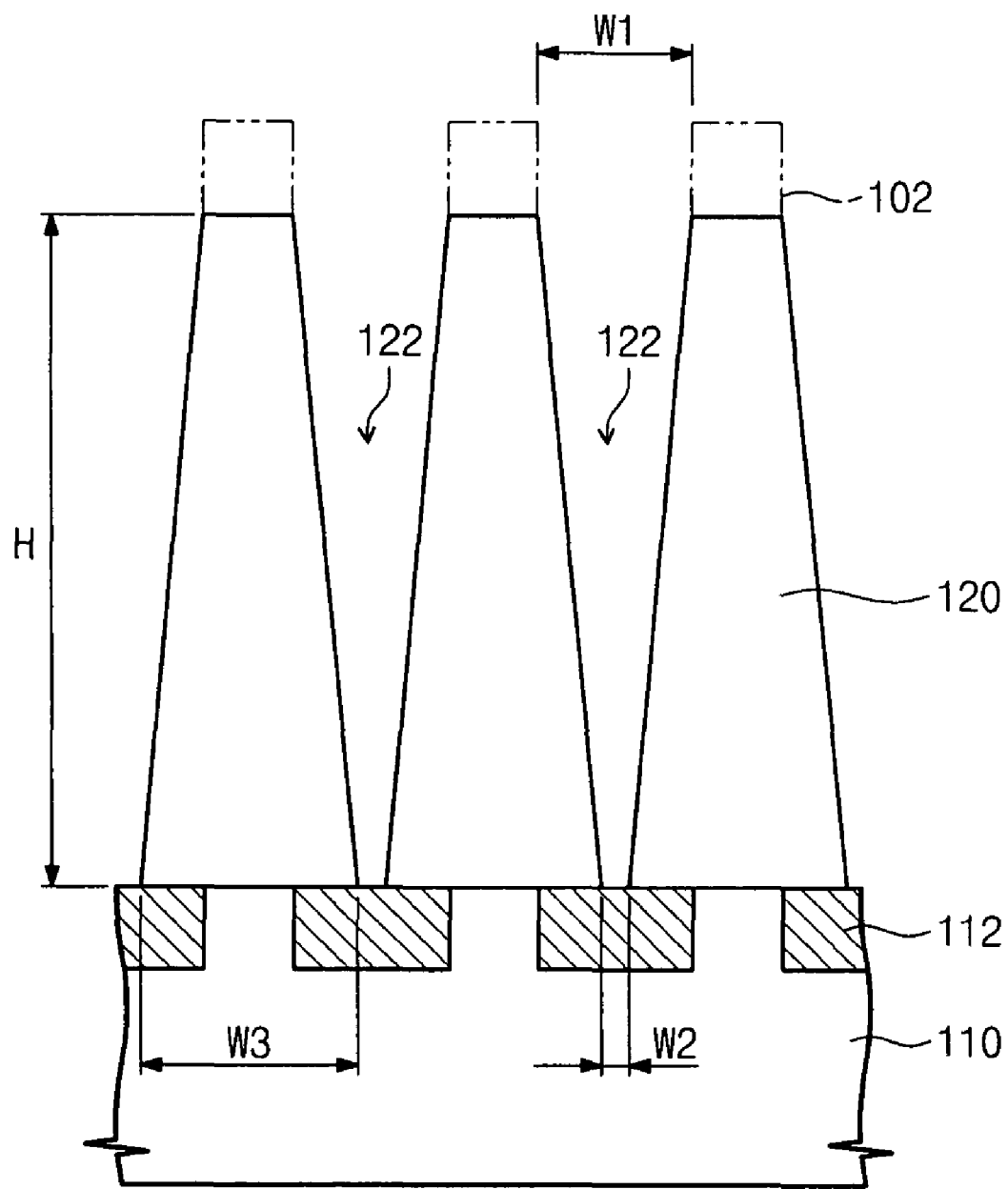

Referring to FIGS. 3 and 4B, the thin film 118 may be patterned to form the thin film pattern 120 with the depression portions 122 on the substrate 110. Forming the thin film pattern 120 may include forming a photoresist pattern 102 on the thin film 118 and patterning the thin film 118 using the photoresist pattern 102 as an etching mask. Patterning the thin film 118 may include performing a dry etching process. The thin film pattern 120, which includes depression portions 122 exposing the conductive layer 112, may be formed through the processes described above. After the thin film pattern 120 is formed, the photoresist pattern 102 may be removed.

Forming the thin film pattern 120 may include forming the depression portions 122 with top widths W1 and initial bottom widths W2, as illustrated in FIG. 4B. For example, the depression portions 122 may have a non-uniform width, e.g., a decreasing width, so the top widths W1 may be larger than the initial bottom widths W2. For example, the depression portions 122 may have a large aspect ratio, i.e., a large ratio of a height H of the depression portion 122 to the initial bottom width W2 of the depression portion 122. The initial bottom width W2 of the depression portion 122 may be smaller than a predetermined bottom width W5 (FIG. 4D). The initial bottom width W2 may be extended to the predetermined bottom width W5 through solution treatment processes, as will be discussed in more detail below with reference to FIGS. 4C and 4D. It is noted that a bottom width of a section of the thin film pattern 120 between two adjacent depression portions 122 may be W3.

Figure 4C:
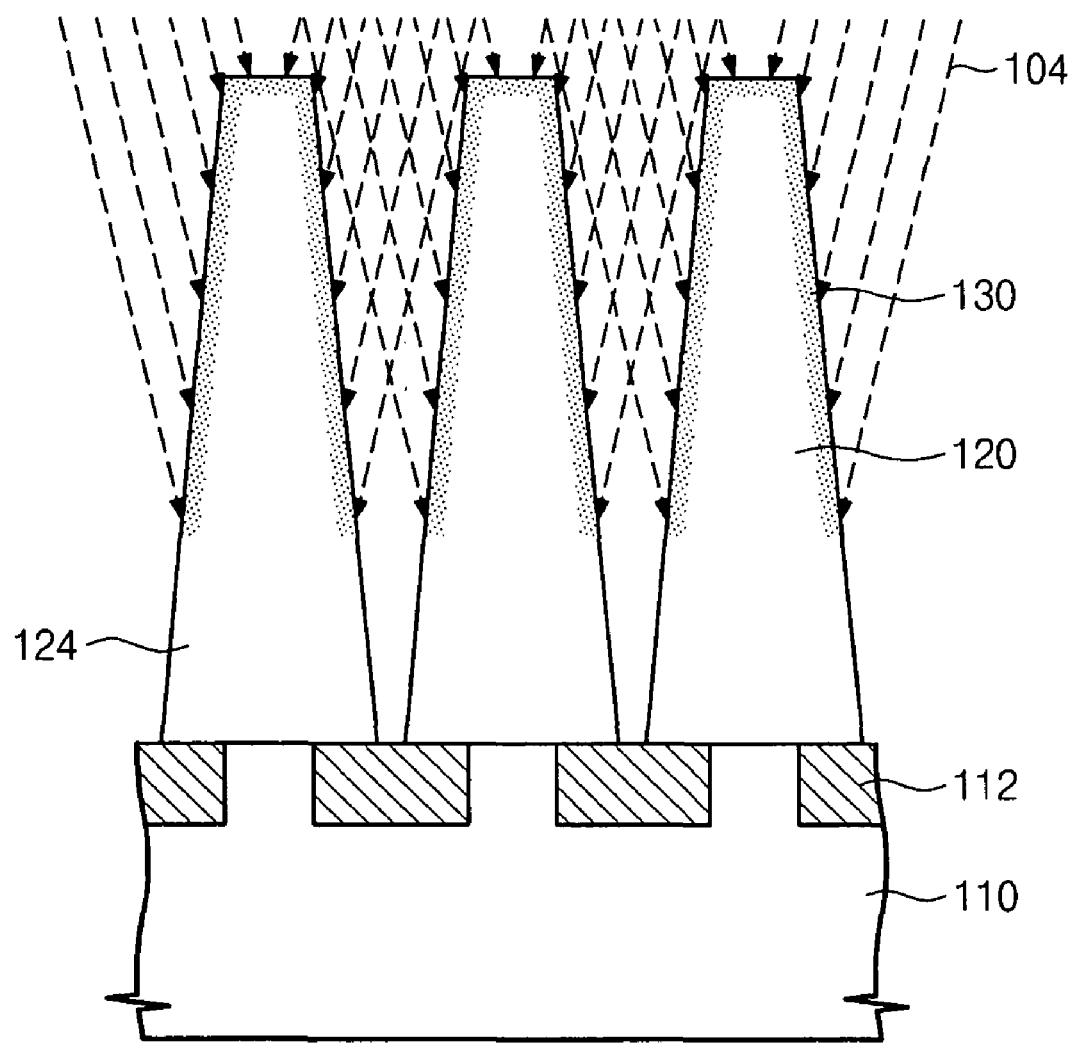
Figure 4D:
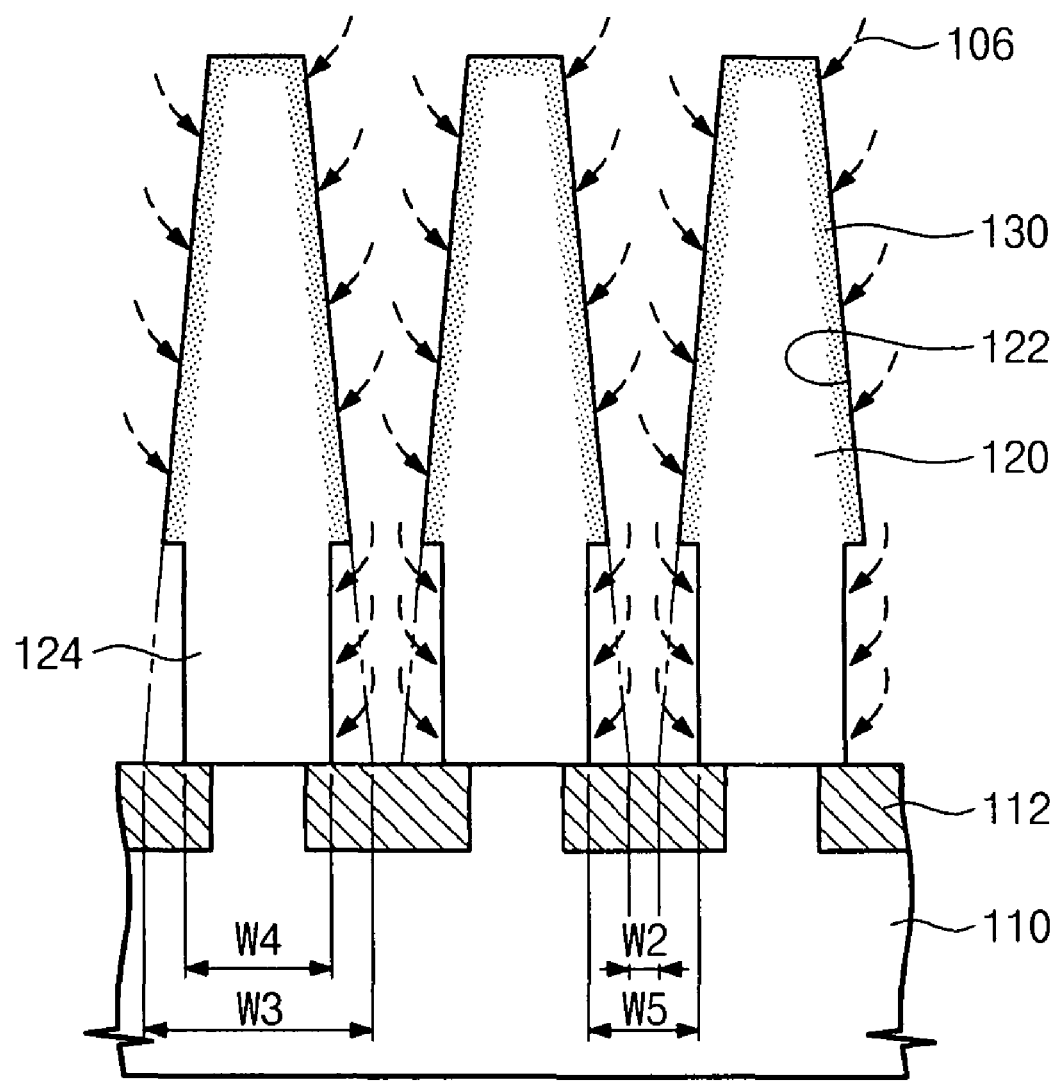

Referring to FIGS. 3 and 4C, the protection layer 130 may be formed on the thin film pattern 120 (S140). Forming the protection layer 130 may include implanting ions 104 into the thin film pattern 120. For example, the protection layer 130 may be formed by implanting ions of one or more of silicon (Si), oxygen (O), nitrogen (N), germanium (Ge) and carbon (C) into the thin film pattern 120. Thus, the protection layer 130 may be a layer of implanted ions that extend to a predetermined thickness inside the film pattern 120. For example, the protection layer 130 may be a silicon oxide layer (SiO), an oxy-nitride layer (ON), a silicon nitride layer (SiN), a silicon oxy-nitride layer (SiON), an oxide germanium layer (OGe), a silicon oxide germanium layer (SiOGe), a silicon nitride germanium layer (SiNGe), a silicon oxy-nitride germanium layer (SiONGe), an carbon mono-oxide layer (CO), a silicon oxy-carbon layer (SiCO), a silicon nitride carbon layer (SiCN), or a silicon oxy-nitride carbon layer (SiCON) on the thin film pattern 120, i.e., extending from an outer surface of the thin film pattern 120 into an interior of the thin film pattern 120. The protection layer 130 may be formed to have an etching selectivity with respect to the thin film pattern 120. Forming the protection layer 130 may include selectively implanting the ions 104 only into the upper portion 120a of the thin film pattern 120. Thus, the protection layer 130 may not be formed on the lower portion 124 of thin film pattern 120.

Forming the protection layer 130 may include performing an oblique ion implantation process. The area, i.e., length along sidewalls of the thin film pattern 120, and thickness of the protection layer 130 may be controlled by adjusting a tilt angle of the ions 104 implanted into the thin film pattern 120 and their implantation energy level.

For example, as illustrated in FIG. 5A, a small implantation angle with respect to a normal to the substrate 110 may increase an implantation area of the thin film pattern 120, i.e., increase a size of the upper portion of the thin film pattern 120 covered with the protection film 130 relative to the lower part 124. In other words, a steeper implantation obliquity of the ions 104 with respect to the substrate 110 may cause the ions 104 to reach deeper into the depression portions 122 to increase a length of the protection film 130 along sidewalls of the thin film pattern 120.

In another example, as illustrated in FIG. 5B, a bigger implantation angle with respect to a normal to the substrate 110 may reduce an implantation area of the thin film pattern 120, i.e., decrease a size of the upper portion of the thin film pattern 120 covered with the protection film 130 relative to the lower part 124. In other words, a gentler implantation obliquity of the ions 104 with respect to the substrate 110 may reduce an implantation depth of the ion 104 within the depression portions 122 to reduce a length of the protection film 130 along sidewalls of the thin film pattern 120. Structures of the thin film pattern 120 may mask ion implantation of adjacent structures.

Thus, the steeper an implantation obliquity of the ions 104 with respect to the substrate 110, an area of the protection layer 130 to be formed may increase, and the gentler an implantation obliquity of the ion 104 with respect to the substrate 110, an area of the protection layer 130 to be formed may decrease. As an area of the protection layer 130 to be formed increases, an area of the lower portion 124 of the thin film pattern 120 not protected by the protection layer 130 may decrease. Similarly, as an area of the protection layer 130 to be formed decreases, an area of the lower portion 124 of the thin film pattern 120 may increase. Controlling the tilt angle of the ions 104 may be performed by adjusting obliquity of the substrate 110, e.g., tilting the substrate 110 with respect to a surface supporting the substrate 110. An implantation efficiency of the ions 104 may be increased by rotating the oblique substrate 110.

A depth of the protection layer 130 may be controlled by an energy level of the implanted ions 104. For example, as an implantation energy level of the ions 104 increases, an implantation depth of the ions 104 within the thin film pattern 120 may increase. As an implantation energy level of the ions 104 decreases, an implantation depth of the ions 104 within the thin film pattern 120 may decrease, i.e., have a low thickness of the protection layer 130.

Referring back to FIG. 3, an annealing process may be performed (S150). The annealing process may be performed before and/or after the oblique ion implantation process. For example, when the annealing process is performed after the oblique ion implantation process, the thin film pattern 120 may thermally interact with the implanted ions to complete formation of the protection layer 130. For example, the annealing process may include a rapid thermal annealing process (RTP) or a furnace annealing process.

Referring to FIGS. 3 and 4D, a solution treatment process may be performed (S160). Performing the solution treatment process may include providing an etching solution 106 to an entire surface of substrate 110 and the layers thereon. The solution treatment process may be a selective wet etching process. For example, performing the solution treatment process may include treating the substrate 110 with an etching solution having a higher etch rate with respect to the thin film pattern 120 than an etch rate with respect to the protection layer 130. For example, the etching solution 106 may include one or more of hydrofluoric acid (HF), sulfuric acid ($H_2SO_4$), nitric acid ($HNO_3$), ammonia ($NH_4OH$), ammonium fluoride ($NH_4F$), hydrochloric acid (HCl), hydrogen peroxide ($H_2O_2$), and ozone ($O_3$). More specifically, examples of the etching solution 106 may include one or more of standard cleaning solution-1 (APM), standard cleaning solution-2 (HPM), sulfurin peroxide mixture (SPM), dilute hydrofluoric acid (DHF), ozonated hydrofluoric acid, buffered oxide etchant (BOE), ozonated water, and deionized water.

In the solution treatment process, the protection layer 130 may be used as an etch stop layer against the etching solution. Thus, the upper portion 120a of the thin film pattern 120 covered with the protection layer 130 may not be etched during the etch process. In other words, only the lower portion 124 of the thin film pattern 120 may be selectively etched by the etching solution. Thus, the bottom width W3 of the lower portion 124 of the thin film pattern 120 may be reduced to a predetermined width W4. Since the bottom width W3 of the lower portion 124 is reduced, the initial bottom width W2 of the depression portions 122, i.e., a width between adjacent portions of the thin film pattern 120, may be increased to the predetermined width W5. In other words, in the process of forming the thin film pattern 120, the initial bottom width W2 of the depression portion 122 may be controlled by considering an etching rate of the etching solution. Thus, the bottom width W3 of the lower portion 124 of the thin film pattern 120 may be reduced, thereby controlling the initial bottom width W2 of the depression portion 122 to the predetermined width W5. A height of the lower portion 124 may be determined by a lower boundary of the protection layer 130, which may, in turn, be determined by the angle of ion implantation, height of adjacent structures of the thin film pattern 120, etc., For example, if the thin film pattern 120 is a silicon oxide layer and the protection layer 130 is a silicon-rich silicon oxide layer, the solution treatment process may be performed using HF solution having hydrofluoric acid concentration of about 2% to about 4%. A result of etching such a thin film pattern 120 by the above HF solution is reported in the table below.

|  | Thin film including an oxide layer | Thin film including an annealed oxide layer | Thin film covered with a protection layer | Thin film covered with an annealed protection layer |
| --- | --- | --- | --- | --- |
| Etching Depth (Å) | 100 | 60 | 40 | 10 |

Referring to the table, when the thin film pattern 120 including a silicon oxide layer is etched with the HF solution, the pattern is etched by about 100 Å. When the thin film pattern 120 including an annealed oxide layer is etched with the HF solution, the pattern is etched by about 60 Å. When the thin film pattern 120 is covered with the protection layer 130, the HF solution etches about 40 Å of the pattern. When the thin film pattern 120 is covered with an annealed protection layer 130, the HF solution etches only about 10 Å of the pattern. Thus, when the solution treatment process is performed, the protection layer 130 and the annealing process may prevent or substantially minimize the thin film pattern 120 from being over etched and/or damaged.

Figure 4E:
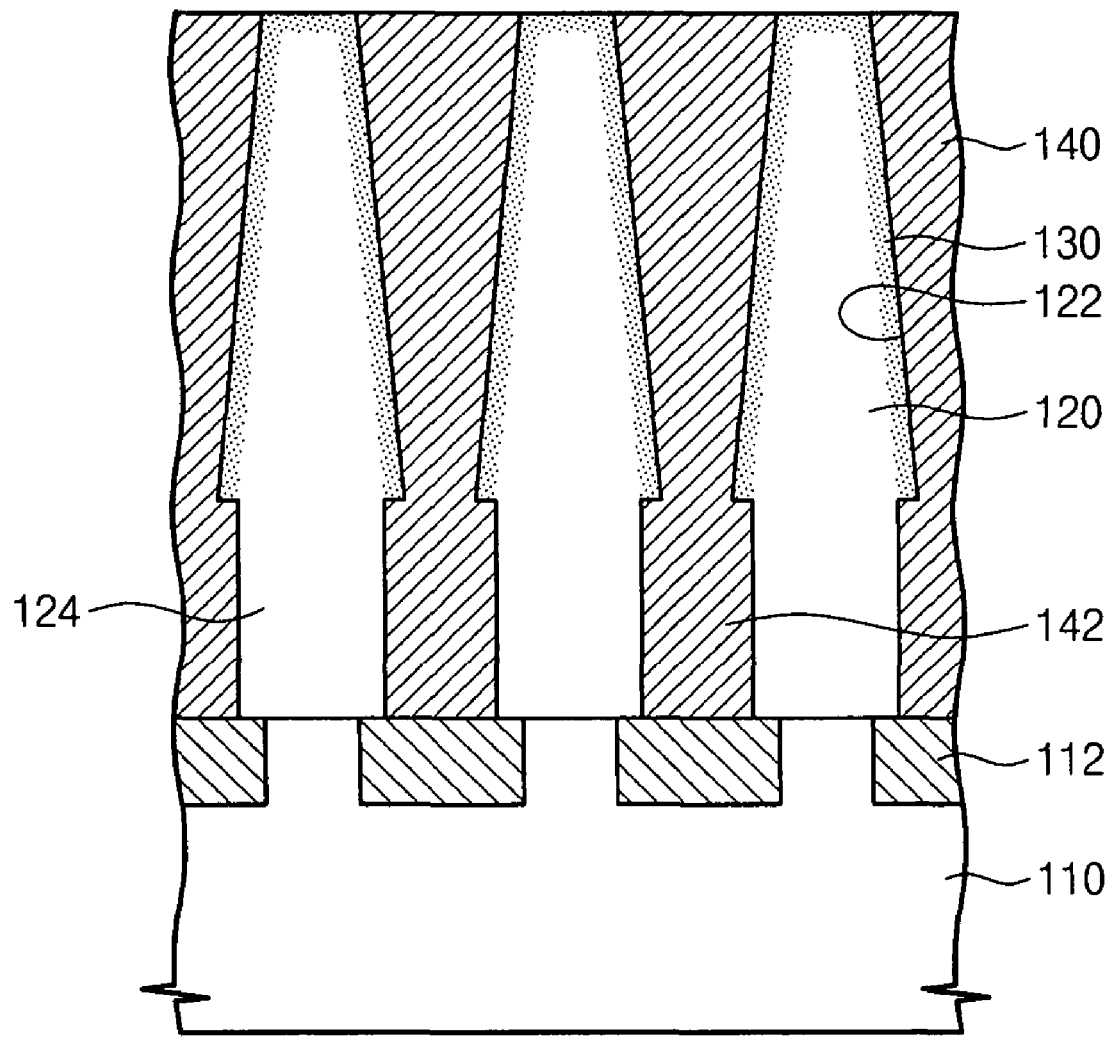

Referring to FIGS. 3 and 4E, the conductor 140 may be formed in the depressions 122 of the thin film pattern 120 (S170). Forming the conductor 140 may include forming a conductive film (not shown) covering an entire surface of the substrate 110. The conductive film may fill the inside of the depression portions 122 of the thin film pattern 120. The conductive film may include a metal layer. For example, the conductive film may include at least one of cobalt (Co), nickel (Ni), tantalum (Ta), tungsten (W), and molybdenum (Mo).

After the conductive film is formed, an etch process of the conductive film may be performed. The etch process of the conductive film may include a chemical mechanical polishing (CMP) process and an etched back process using the thin film pattern 120 as an etch stop layer. Accordingly, the conductor 140 filling the inside of the depression portions 122 may be formed on the substrate 110. The conductor 140 may include the extension portion 142. That is, as described with reference to FIG. 4D, the initial bottom width W2 of the depression portion 122 may be increased to the predetermined width W5 during the solution treatment process. Thus, the extension portion 142 may be formed to fill the predetermined width W5 of the depression portion 122 to define a wide lower portion of the conductor 140. A contact area between the conductor 140 and the conductive layer 112 may be increased by the extension portion 142, i.e., due to the increased bottom width of the depression portion 122, so a contact resistance between the conductor 140 and the conductive layer 112 may be reduced.

As described above, the pattern structure 100 in accordance with an embodiment may include the protection layer 130 exposing the lower portion 124 of the thin film pattern 120 during the solution treatment process. When the solution treatment process is performed, the protection layer 130 may be used as an etch stop layer to protect the upper portion 120*a* of the thin film pattern 120, while the lower portion 124 of the thin film pattern 120 may be selectively etched to increase a width of an adjacent depression 122. Therefore, the conductor 140 in the pattern structure 100 may include an extension portion 142 to fill the increased width of the depression 122 in order to have an increased surface contact with an underlying conductive layer. Thus, according to an embodiment, a contact resistance of the conductor 140 used as a contact plug or a metal interconnection may be reduced.

Figure 6:
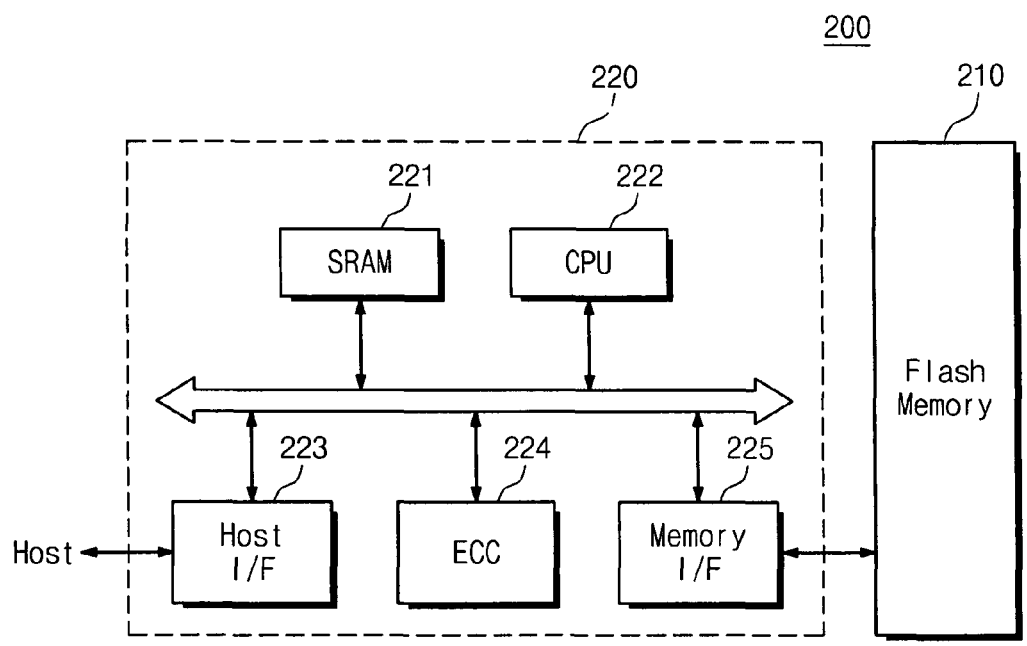
FIG. 6 illustrates a block diagram of an electronic apparatus including a semiconductor device having a pattern structure according to an embodiment.

FIG. 6 illustrates a block diagram of an electronic apparatus including a semiconductor device having a pattern structure according to an embodiment. Referring to FIG. 6, a semiconductor device according to embodiments may be included in a memory card 200 for supporting a storage capacity of huge amounts of data. The memory card 200 may include a memory controller 220 controlling data exchange between a host and a flash memory device 210. The flash memory device 210 may include a plurality of flash memory cells, e.g., NAND memory cells, formed as described above.

A SRAM 221 may be used as an operation memory of a central processing unit (CPU) 222. A host interface (I/F) 223 may include a data exchange protocol of a host connected to the memory card 200. An error correction block 224 may detect and correct an error included in data read from a multi bit flash memory device 210. A memory I/F 225 may interface with the flash memory device 210. The CPU 222 may perform control operation for data exchange of the memory controller 220. Although not depicted, the memory card 200 may further include ROM (not shown) to store code data for interfacing with the host. Particularly, the flash memory device may be provided to a memory system such as a solid state disk (SSD).

Figure 7:
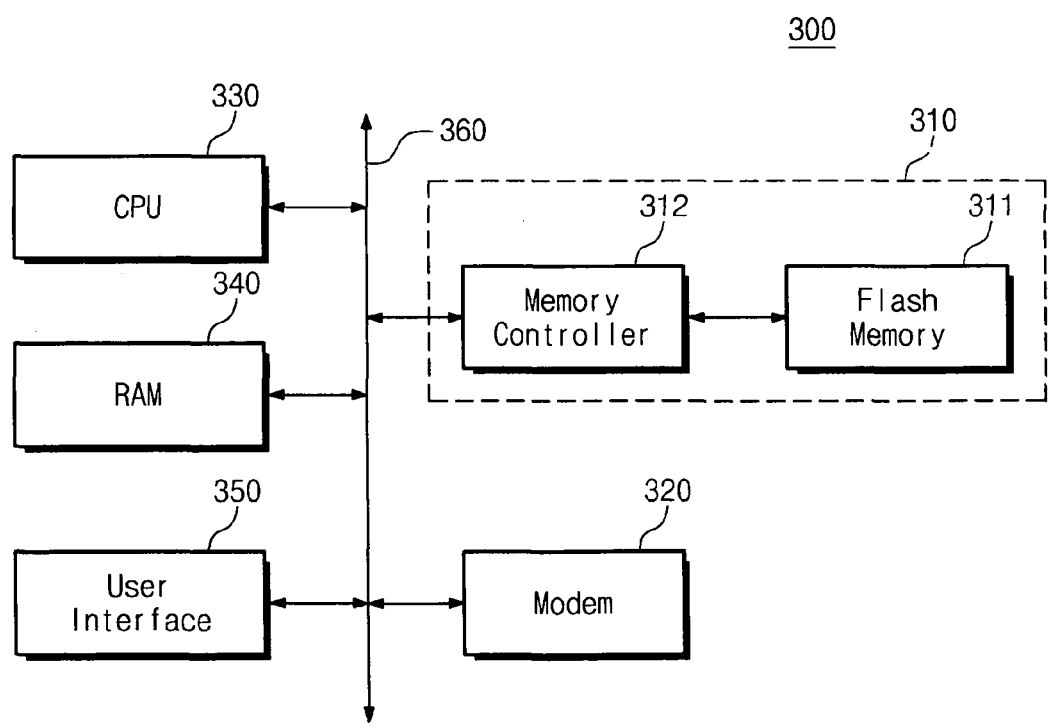
FIG. 7 illustrates a block diagram of a memory system including a semiconductor device having a pattern structure according to an embodiment.

FIG. 7 illustrates a block diagram of a memory system including a semiconductor device having a pattern structure according to an embodiment. Referring to FIG. 7, a semiconductor device may be included in a data processing system 300, e.g., a mobile device or a desktop computer.

The data processing system 300 may include a flash memory system 310, a modem 320, a central processing device 330, a RAM 340, and a user interface 350 that are electrically connected to a system bus 360. The flash memory system 310 may include a flash memory device 311 and a memory controller 312 to control the flash memory device 311. The flash memory device 311 may be substantially the same as the flash memory device 210 described previously with reference to FIG. 6. The flash memory system 310 may store data processed by the central processing device 330 and data received from the outside. Here, the flash memory system 310 may include a SSD, so the data processing device 300 may stably store huge amounts of data in the flash memory system 310. As reliability increases, the flash memory system 310 may reduce resources required to correct an error to provide a high speed data exchange function to the data processing system 300. Although not depicted, the data processing system 300 may further include, e.g., an application chipset, a camera image processor, and an input/output device.

A pattern structure in accordance with embodiments may include a thin film pattern with a protection layer used as an etch stop layer, thereby reducing etch damage to the thin film pattern. Thus, the pattern structure may have a thin film pattern with substantially no damage during a solution treatment process. The pattern structure may further include a contact plug and a metal interconnection with reduced a contact resistance. A method of forming the pattern structure according to embodiments may include forming the protection layer on the thin film pattern by an oblique ion implantation process, thereby preventing damage to the thin film pattern during a solution treatment process.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:
1. A method of forming a pattern structure, comprising:
   forming a thin film pattern on a substrate, the thin film pattern including depression portions with first bottom widths;
   forming a protection layer on the thin film pattern by implanting ions into the thin film pattern; and etching a lower portion of the thin film pattern selectively using the protection layer as a mask to increase the first bottom widths of the depression portions into second bottom widths.

2. The method as claimed in claim 1, wherein forming the protection layer includes implanting ions into an upper portion of the thin film pattern, such that the lower portion of the thin film pattern is exposed.

3. The method as claimed in claim 2, wherein forming the protection layer includes implanting ions only into the upper portion of the thin film pattern, such that etching of the lower portion is performed selectively between the substrate and the upper portion of the thin film pattern.

4. The method as claimed in claim 1, wherein:
forming the thin film pattern includes forming an oxide layer on the substrate, and
forming the protection layer includes forming a film having a lower etch rate than the oxide layer, the film including at least one of a silicon oxide (SiO), an oxy-nitride (ON), a silicon nitride (SiN), a silicon oxy-nitride (SiON), an oxide germanium (OGe), a silicon oxide germanium (SiOGe), a silicon nitride germanium (SiNGe), a silicon oxy-nitride germanium (SiONGe), an carbon mono-oxide (CO), a silicon oxy-carbon (SiCO), a silicon nitride carbon (SiCN), and a silicon oxy-nitride carbon (SiCON).

5. The method as claimed in claim 1, wherein forming the protection layer includes performing an oblique ion implantation process on the thin film pattern, a thickness of the protection layer into the thin film pattern and a length of the protection layer along an upper portion of the thin film pattern relative to a depth of the depression being controlled by adjusting ion implantation angle and energy level, respectively.

6. The method as claimed in claim 1, wherein forming the protection layer includes implanting ions of at least one of silicon (Si), oxygen (O), nitrogen (N), germanium (Ge) and carbon (C) into the thin film pattern.

7. The method as claimed in claim 1, wherein etching the lower portion of the thin film pattern includes selectively performing a solution treatment on the lower portion of the thin film pattern.

8. The method as claimed in claim 1, further comprising annealing the thin film pattern.

9. The method as claimed in claim 8, wherein the annealing is performed before the etching.

10. The method as claimed in claim 9, wherein the annealing is performed after forming the protection layer.

11. The method as claimed in claim 1, further comprising forming a conductor in at least one of the depression portions, such that the conductor fills the entire second bottom width of the depression portion.

12. The method as claimed in claim 11, wherein forming the conductor includes positioning the conductor in direct contact with a conductive layer in the substrate, such that the second bottom width of the depression portion defines a length of a surface contact between the conductor and the conductive layer.

13. A method of forming a pattern structure, comprising:
forming a thin film on a substrate, the substrate including a conductive layer;
forming depression portions in the thin film to form a thin film pattern having first bottom widths, the depression portions exposing the conductive layer;
implanting ions into an upper portion of the thin film pattern to form a protection layer on the upper portion of the thin film pattern;
extending the first bottom widths of the depression portions in an area adjacent to the conductive layer to second bottom widths by selectively etching a lower portion of the thin film pattern using the protection layer as a mask; and
forming a conductor electrically connected to the conductive layer by filling at least one depression portion.

14. The method as claimed in claim 13, wherein
the lower portion of the thin film pattern is between the protection layer and the substrate and is exposed by the protection layer.

15. The method as claimed in claim 13, wherein extending the first bottom widths of the depression portions includes etching only the lower portion of the thin film pattern, such that top widths of the depression portions are substantially constant.

16. The method as claimed in claim 13, wherein forming the conductor includes filling the second bottom width of the depression portion with a conductive material, the second bottom width of the depression portion defining a length of a surface contact between the conductive layer and the conductor.

* * * * *